United States Patent [19]
Hashimoto

[11] Patent Number: 5,530,671
[45] Date of Patent: Jun. 25, 1996

[54] SEMICONDUCTOR MEMORY DEVICE HAVING PRESETTING FUNCTION OF SENSE AMPLIFIER

[75] Inventor: Kiyokazu Hashimoto, Tokyo, Japan

[73] Assignee: NEC Corporation, Japan

[21] Appl. No.: 320,457

[22] Filed: Oct. 11, 1994

[30] Foreign Application Priority Data

Oct. 13, 1993 [JP] Japan ................................ 5-280141

[51] Int. Cl.⁶ ................................................ G11C 11/40
[52] U.S. Cl. ........................... 365/189.07; 365/233.5
[58] Field of Search ....................... 365/189.07, 233.5, 365/207, 208, 185.21

[56] References Cited

U.S. PATENT DOCUMENTS 4,972,374 11/1990 Wang ..................... 365/233.5
5,268,874 12/1993 Yamauchi .................. 365/233.5
5,396,467 3/1995 Liu ......................... 365/189.07

OTHER PUBLICATIONS

"A 68–ns 4–Mbit CMOS EPROM with High–Noise–Immunity Design", K. Imamiya, et al, IEEE Journal of Solid–State Circuits, vol. 25, No. 1, Feb. 1990, pp. 72–77.

*Primary Examiner*—A. Zarabian

[57] ABSTRACT

In a semiconductor memory device including a memory cell array, a digit line for receiving read data from a selected one of read-only memory cells of the memory cell array, a sense amplifier for sensing a voltage at the digit line to generate a sense voltage signal, and a comparator for comparing the sense voltage signal with a reference voltage signal to generate an output signal, a presetting circuit and a constant voltage generating circuit are provided to preset the sense voltage signal by receiving an address transition detection signal.

10 Claims, 16 Drawing Sheets

SEMICONDUCTOR MEMORY DEVICE HAVING PRESETTING FUNCTION OF SENSE AMPLIFIER

BACKGROUND OF THE INVENTION

1. Field of the Invention

The present invention relates to a semiconductor memory device including read-only memory (ROM) cells, and more particularly, to a presetting function of a sense amplifier in such a semiconductor memory device.

2. Description of the Related Art

ROM devices are broadly divided into a mask ROM device and a nonvolatile ROM device such as an erasable programmable ROM (EPROM) device and an electrically erasable programmable ROM (EEPROM) device.

In a mask ROM device, binary data "0" or "1" of a memory cell corresponds to:

the presence or absence of an enhancement type transistor;

the low or high threshold voltage of a transistor;

the depletion type or enhancement type of a transistor; or the presence or absence of a contact window (through-hole) which connects a transistor to one bit line.

Similarly, in an EPROM device or an EEPROM device, binary data "0" or "1" corresponds to the low or high threshold voltage of a transistor, which is determined by introducing carriers (electrons) into a floating gate due to a tunnel effect.

A prior art ROM device includes a memory cell array formed by ROM memory cells, a digit line for receiving read data from a selected one of the ROM memory cells, a sense amplifier for sensing a voltage at the digit line to generate a sense voltage signal, a reference circuit for generating a reference voltage signal, and a comparator for comparing the sense voltage signal with the reference voltage signal to generate an output signal. Further, an equalizer is provided between the sense amplifier and the reference circuit, to thereby enhance a read operation speed. In this case, the equalizer is operated by a so-called address transition detection signal (see: K. Imamiya et al., "A 68-ns 4 Mbit CMOS EPROM with High-Noise-Immunity Design", IEEE Journal of Solid-State Circuits, Vol. 25, No.1, pp. 72–77, February 1990). This will be explained later in detail.

In the above-described prior art ROM device, however, since the digit line is precharged by the equalizer, i.e., by the sense amplifier and the reference circuit, the power dissipation thereof is increased. Particularly, when this prior art ROM device is applied to a page mode ROM device, power dissipation is further increased due to the increased number of reference circuits. Also, in this case, the increased number of reference circuits deteriorates the integration. Note that, in a page mode ROM device, if the number of reference circuits is forcibly decreased, the read operation speed is reduced.

SUMMARY OF THE INVENTION

It is an object of the invention to present invention to reduce the dissipation power in a ROM device.

Another object is to reduce the power dissipation and enhance the integration in a page mode ROM device and a parallel bit output ROM device.

According to the present invention, in a ROM device including a memory cell array, a digit line for receiving read data from a selected one ROM cell of the memory cell array, a sense amplifier for sensing a voltage at the digit line to generate a sense voltage signal, and a comparator for comparing the sense voltage signal with a reference voltage signal to generate an output signal, a presetting circuit and a constant voltage generating circuit are provided to preset the sense voltage signal by receiving an address transition detection signal. Thus, since the digit line is precharged by the sense amplifier including the presetting circuit, not by the reference circuit, the power dissipation can be reduced. Also, since the reference circuit does not precharge the digit line, the number of reference circuits can be reduced in a page mode ROM device and a parallel bit output ROM device, thus enhancing the integration.

BRIEF DESCRIPTION OF THE DRAWINGS

The present invention will be clearly understood from the description as set forth below, as compared with the prior art, with reference to the accompanying drawings, wherein.

DESCRIPTION OF THE PREFERRED EMBODIMENTS

Before the description of the preferred embodiments, prior art ROM devices will be explained with reference to FIGS. 1 through 10.

Figure 1:
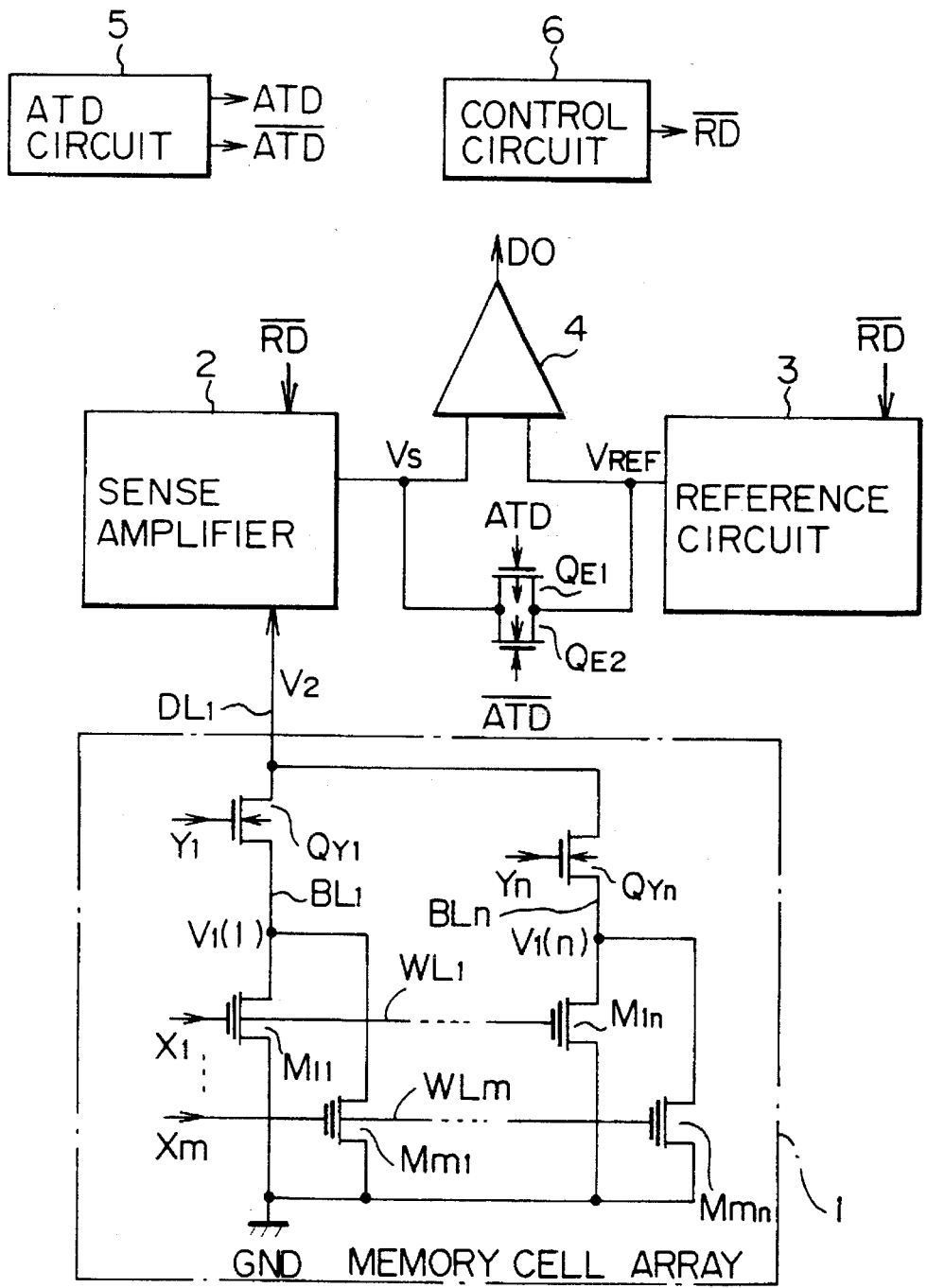
FIG. 1 is a block circuit diagram illustrating a prior art ROM device.

In FIG. 1, which illustrates a prior art ROM device, reference numeral 1 designates a memory cell array formed by nonvolatile memory cells $M_{11}, \ldots, M_{1n}, \ldots, M_{m1}, \ldots, M_{mn}$ each having a source connected to the ground GND, a drain connected to one of bit lines $BL_1, \ldots, BL_n$, a floating gate, and a control gate connected to one of word lines $WL_1, \ldots, WL_m$. The bit lines $BL_1, \ldots, BL_n$ are connected via column selection transistors (N-channel enhancement type MOS transistors) $Q_{Y1}, \ldots, Q_{Yn}$ to a digit line $DL_1$. One of X address signals $X_1, \ldots, X_m$ is made by a row decoder (not shown) high, and therefore, one of the word lines $WL_1, \ldots, WL_m$ is selected. Similarly, one of Y address signals $Y_1, \ldots, Y_n$ is made high by a column decoder (not shown), and therefore, one of the bit lines $BL_1, \ldots, BL_n$ is selected and is connected to the digit line $DL_1$. Thus, data is read from a selected memory cell to the digit line $DL_1$.

Reference numeral 2 designates a sense amplifier for sensing a voltage $V_2$ at the digit line $DL_1$ to generate a sense voltage signal $V_s$. Also, reference numeral 3 designates a reference circuit for generating a reference voltage signal $V_{REF}$. The sense voltage signal $V_s$ is compared with the reference voltage signal $V_{REF}$ by a comparator 4 which generates an output signal DO.

Reference numeral 5 designates an address transition detection (ATD) circuit for detecting a transition of at least one of the X address signals $X_1, \ldots, X_m$ and the Y address signals $Y_1, \ldots, Y_n$ to generate a signal ATD and its inverted signal $\overline{ATD}$.

Reference numeral 6 designates a control circuit for controlling the entire device of FIG. 1. The control circuit 6 generates a read mode signal RD and the like.

References $Q_{E1}$ and $Q_{E2}$ are a P-channel enhancement type transistor and an N-channel enhancement type transistor, respectively, which serve as an equalizer for equalizing the sense voltage $V_s$ with the reference voltage $V_{REF}$ in response to the signals ATD and $\overline{ATD}$.

Figure 2:
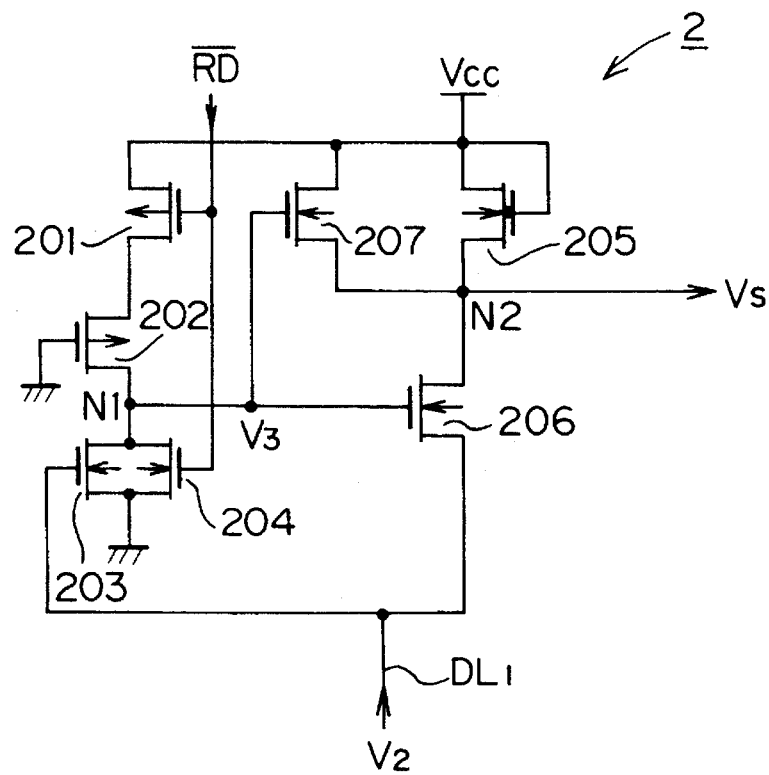
FIG. 2 is a detailed circuit diagram of the sense amplifier of FIG. 1.

In FIG. 2, which is a detailed circuit diagram of the sense amplifier 2 of FIG. 1, the sense amplifier 2 is of a feedback NOR circuit type formed by a P-channel enhancement type MOS transistor 201 controlled by the read mode signal RD, a P-channel enhancement type transistor 202 serving as a load, two N-channel enhancement type MOS transistors 203 and 204 controlled by the voltage $V_2$ at the digit line $DL_1$ and the read mode signal RD, a non-doped N-channel MOS transistor 205 seving as a load, an N-channel enhancement type MOS transistor 206, and a precharging N-channel enhancement type MOS transistor 207. When the control is in a write mode ($\overline{RD}$=high), the transistors 201 and 204 are turned OFF and ON, respectively, so that the sense amplifier 2 is disabled, while, when the control is in a read mode ($\overline{RD}$=low), the transistors 201 and 204 are turned ON and OFF, respectively, so that the sense amplifier 2 is enabled. Also, the driving power of the transistor 205 is determined in view of a memory cell-on current. Further, the transistors 201 to 204 have a sufficiently high gain to amplify the input voltage $V_2$ of the sense amplifier 2.

The characteristics of the sense amplifier 2 of FIG. 2 will now be explained with reference to FIG. 3 which shows an input/output characteristic of the transistor 206.

Figure 3:
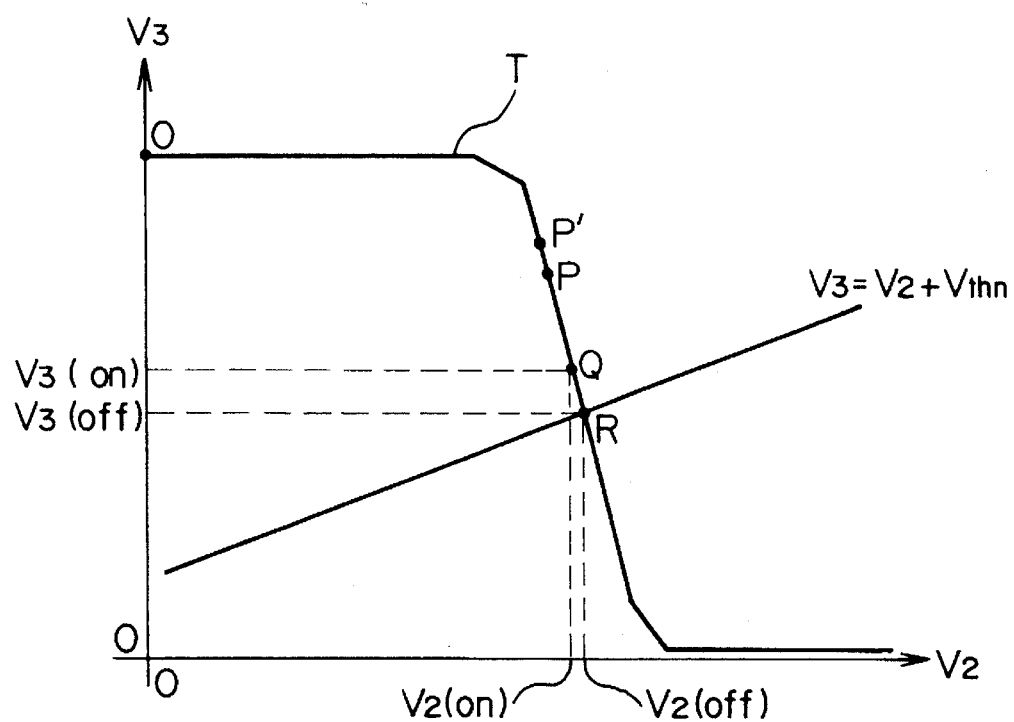
FIG. 3 is a graph showing the input/output characteristics of the output transistor of the sense amplifier of FIG. 2.

In a read mode ($\overline{RD}$=low), the digit line $DL_1$ is usually biased by the transistors 202, 203, and 205 to 207, so as to satisfy the following condition at point R of FIG. 3:

$$V_3 = V_2 + V_{thn}$$

where $V_3$ is the voltage at a node N1; and $V_{thn}$ is a threshold voltage of the transistor 206.

Note that point R corresponds to a state where a memory cell having data "1" (off state) is selected, and therefore, the values of the voltages $V_2$ and $V_3$ at point R are defined as $V_2$(off) and $V_3$(off), respectively.

When a memory cell having data "0" (on state) is selected, a current flows through this memory cell to decrease the voltage $V_2$, so that the control is transferred to an equilibrium point Q. Therefore, the values of the voltages $V_2$ and $V_3$ at point Q are defined as $V_2$(on) and $V_3$(on), respectively. In more detail, if the voltage $V_2$ at the digit line $DL_1$ is intially at 0 V, the digit line $DL_1$ is charged by the precharging transistor 207 and the transistor 207, so that the control is transferred along a characteristic line T from point O to point P. After that, since the precharging transistor 207 is turned OFF, the digit line $DL_1$ is charged by only the transistor 205, so that the control is transferred from point P to point Q.

Also, when selection of a memory cell having data "0" is switched to selection of a memeory cell having "1", the control is transferred from point Q via point P' to point R. Further, when selection of a memory cell having data "1" is switched to selection of a memeory cell having "0", the control is transferred from point R via point P' to point Q.

Figure 4:
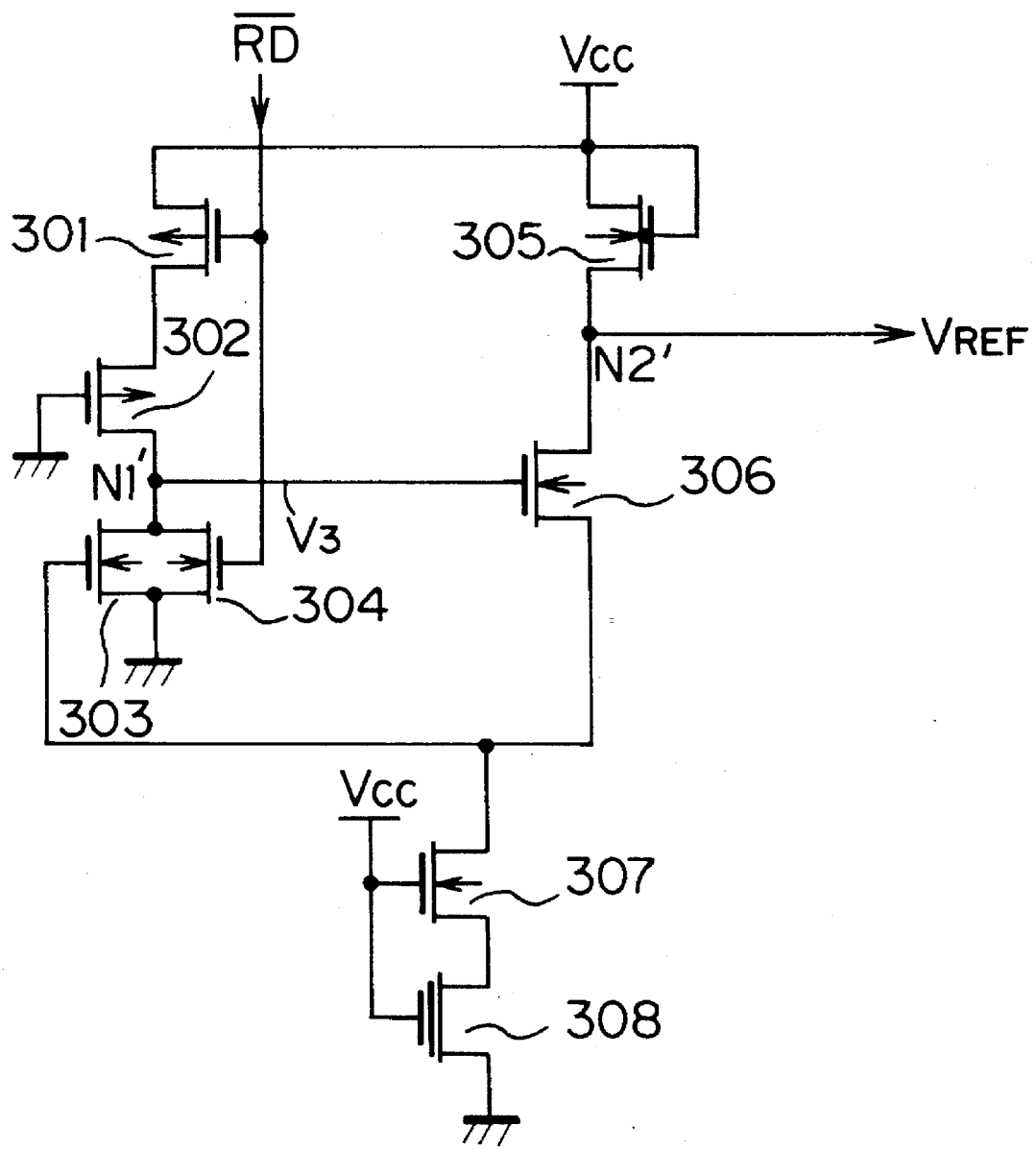
FIG. 4 is a detailed circuit diagram of the reference circuit of FIG. 1.

In FIG. 4, which is a detailed circuit diagram of the reference circuit 3 of FIG. 1, the reference circuit 3 is of a feedback NOR cirucit type formed by a P-channel enhancement type MOS transistor 301 controlled by the read mode signal $\overline{RD}$, a P-channel enhancement type transistor 302 serving as a load, an N-channel enhancement type MOS transistors 303, an N-channel enhancement type MOS transistor 304 controlled by the read mode signal $\overline{RD}$, a non-doped N-channel MOS transistor 305 seving as a load, and an N-channel enhancement type MOS transistor 306. The gate of the transistor 303 and the source of the transistor 306 are connected to an N-channel enhancement type MOS transistor 307 corresponding to one of the column selction transistors $Q_{Y1}, \ldots, Q_{Ym}$ and a dummy memory cell 308 corresponding to one of the memory cells $M_{11}, \ldots$ Also, the precharging transistor 207 is not provided, and instead of this, the ratio (W/L) of a gate width to a gate length of the transistor 305 is larger than that of the transistor 205. Also, in this case, when the control is in a write mode ($\overline{RD}$=high), the transistors 301 and 304 are turned OFF and ON, respectively, so that the reference circuit is disabled, while, when the control is in a read mode ($\overline{RD}$=low), the transistors 301 and 304 are turned ON and OFF, respectively, so that the reference circuit 2 is enabled.

Figure 5:
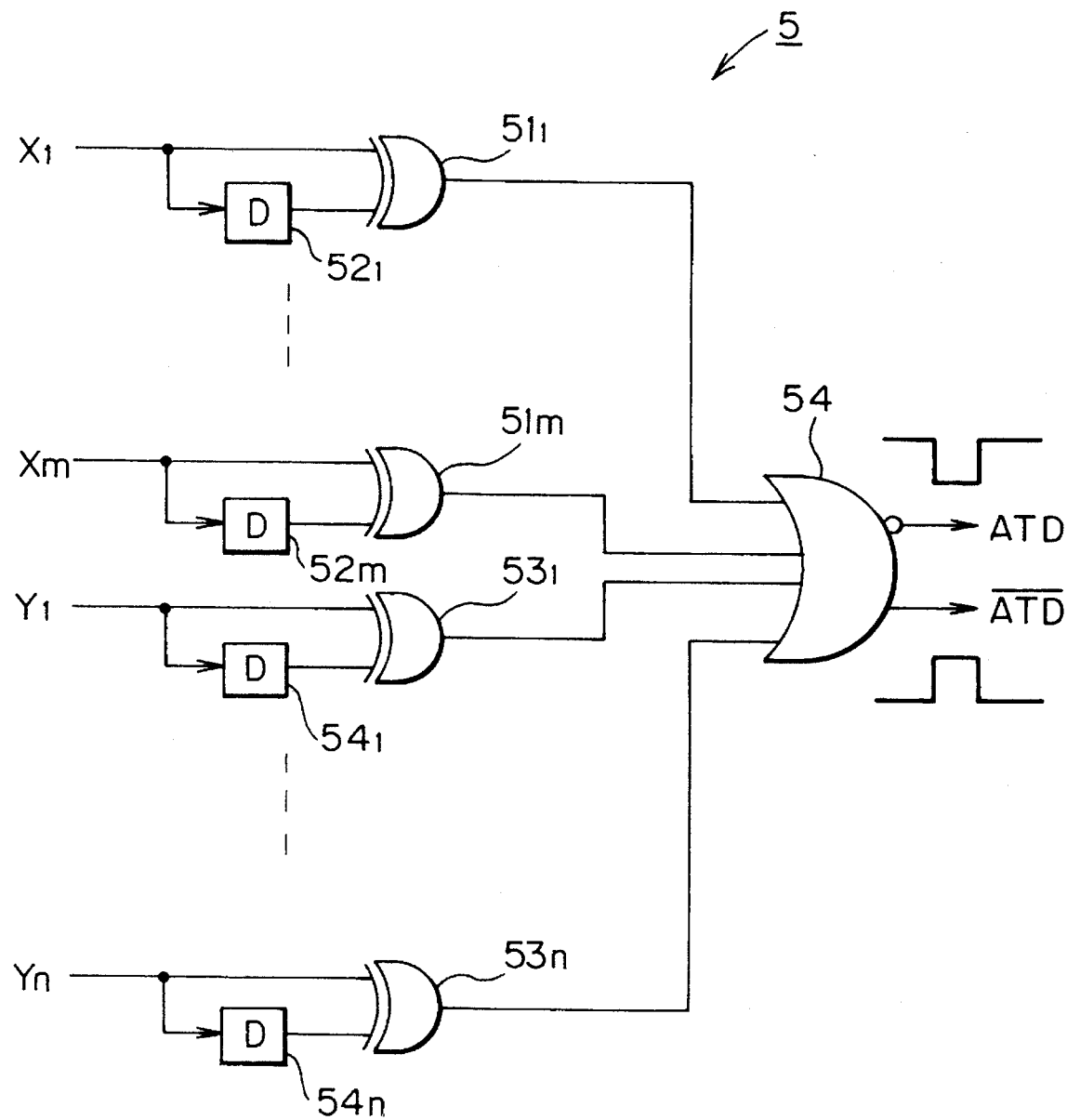
FIG. 5 is a detailed circuit diagram of the address transition detection circuit of FIG. 1.

In FIG. 5, which is a detailed cirucit diagram of the address transition detection circuit 5 of FIG. 1, the address transition detection circuit 5 includes an exclusive OR circuit $51_1$ and a delay circuit $52_1$ for detecting a transition of the X address signal $X_1, \ldots$, an exclusive OR circuit $51_m$ and a delay circuit $52_m$ for detecting a transition of the X address signal $X_m$, an exclusive OR circuit $53_1$ and a delay circuit $54_1$ for detecting a transition of the Y address signal $Y_1, \ldots$, an exclusive OR circuit $53_n$ and a delay circuit $54_n$ for detecting a transition of the Y address signal $Y_n$. The outputs of the exclusive OR circuits $51_1, \ldots, 51_m, 53_1, \ldots, 53_n$ are supplied to an OR circuit 54 having an inverted output terminal for generating the signal ATD and a non-inverted output terminal for generating the signal $\overline{ATD}$. That is, when at least one of the address signals $X_1, \ldots, X_m, Y_1, \ldots, Y_n$ is changed, the corresponding exclusive OR circuit generates a pulse signal having a pulse width determined by the delay circuit $52_1, \ldots, 52_m, 53_1, \ldots,$ or $53_n$, and as a result, the OR circuit 54 generates the pulse signals ATD and $\overline{ATD}$.

Figure 6:
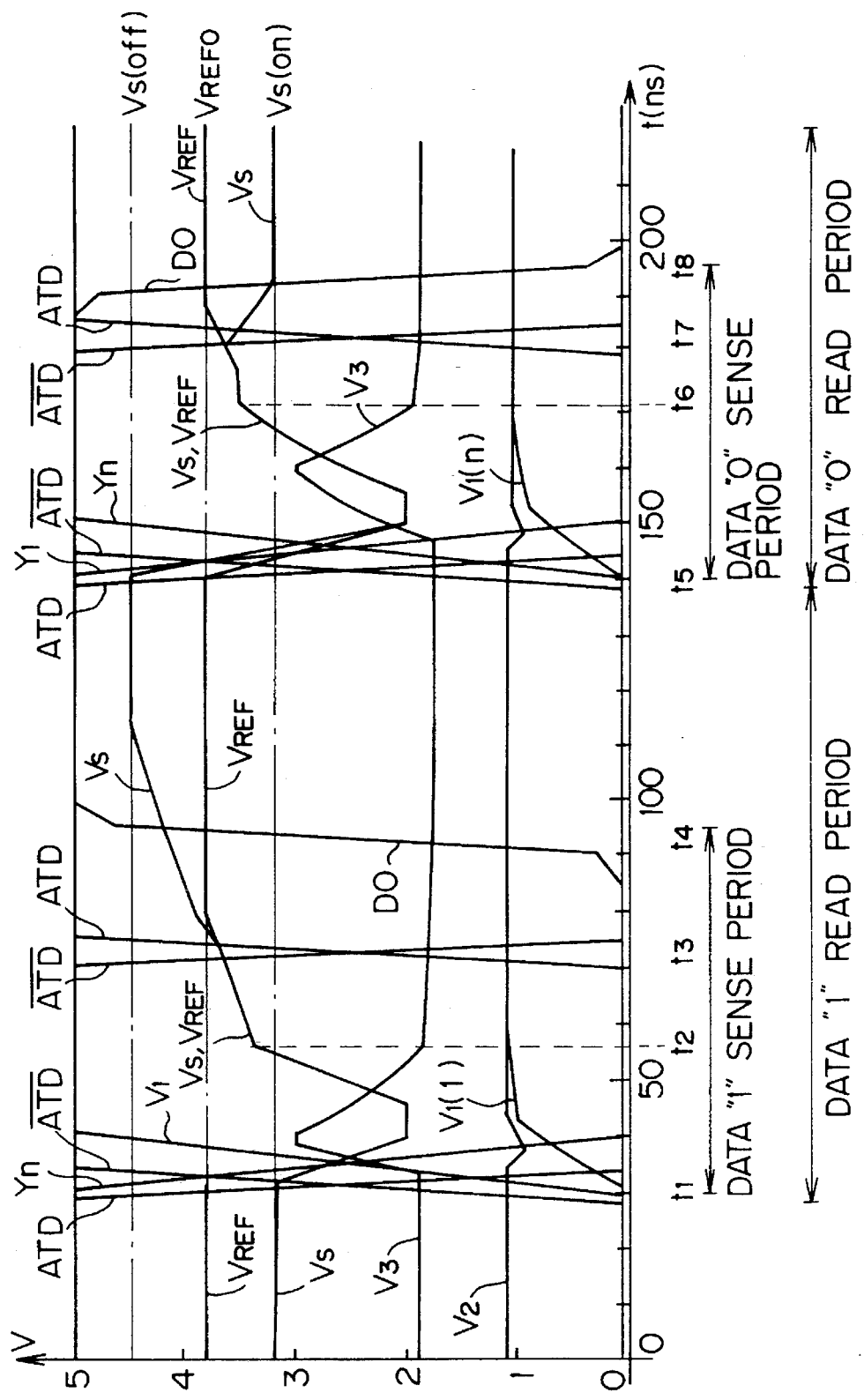
FIG. 6 is a timing diagram showing the operation of the ROM device of FIG. 1.

The operation of the ROM device of FIGS. 1, 2, 4 and 5 will be explained next with reference to FIG. 6. In FIG. 6, assume that the read mode signal RD is low, and only the X address signal $X_1$ is made high and the other X address signals are low. Also, assume that the memory cell $M_{11}$ stores data "1" (off state) and the memory cell $M_{1n}$ stores data "0" (on state).

At time $t_1$1, the Y address signal $Y_n$ is made low to turn OFF the transistor $Q_{Yn}$ and the Y address signal $Y_1$ is made high to turn ON the transistor $Q_{Y1}$, so that the memory cell $M_{11}$ is selected. As a result, the output signals ATD and $\overline{ATD}$ of the address transition detection circuit 5 are changed to be low and high, respectively, and therefore, the equalizer ($Q_{E1}$, $Q_{E2}$) is turned ON. Thus, the sense voltage $V_s$ of the sense amplifier 2 and the reference voltage $V_{REF}$ of the reference circuit 3 are equalized, i.e., $V_s=V_{REF}$. At this time, since the bit line $BL_1$ is charged to increase the voltage $V_1(1)$ thereof, the voltage $V_2$ at the digit line $DL_1$ is decreased and the voltage $V_3$ at the node N1 is increased. As a result, the transistor 206 is turned ON, and therefore, the digit line $DL_1$ and the bit line $BL_1$ are charged by the transistors 205 and 207 of the sense amplifier 2 and the transistor 305 of the reference circuit 3 to increase the voltage $V_2$ and $V_1(1)$ thereof. Due to this charging operation, the sense voltage $V_s$ of the sense amplifier 2 and the reference voltage $V_{REF}$ of the reference circuit 3 are rapidly decreased.

When the charging operation of the digit line $DL_1$ and the bit line $BL_1$ proceeds, the voltage $V_3$ at the node N1 is decreased and the sense voltage $V_s$ ($=V_{REF}$) is increased. As a result, at time $t_2$, when the difference between the voltage $V_3$ and the voltage $V_2$ reaches the threshold voltage $V_{thn}$ of the transistor 206, the transistor 206 is turned OFF. After that, the charging operation for the node N2 ($V_s=V_{REF}$) is gradually carried out by only the transistor 205.

At time $t_3$, when the voltage $V_2$ at the digit line $DL_1$ enters an equilibrium state, the output signals ATD and $\overline{ATD}$ of the address transition detection circuit 5 are charged to be at a high level and at a low level, respectively, and the equalizer ($Q_{E1}$, $Q_{E2}$) is disabled, so that the sense amplifier 2 is electrically disconnected from the reference circuit 3. As a result, the sense voltage signal $V_s$ of the sense amplifier 2 is increased to:

$$V_s(\text{off})=V_{cc}-V_{tho} \quad (2)$$

where $V_{tho}$ is a threshold voltage of the transistor 205. On the other hand, the reference voltage signal $V_{REF}$ remains at $$V_{REF}=V_{REFO} \quad (3)$$

Therefore, at time $t_4$, when $V_s-V_{REF}>\alpha$ ($\alpha$ is a definite value), the comparator 4 converts its output DO from low to high.

Thus, a data "1" sense speed is determined by a time period from time $t_1$ to time $t_4$.

Next, at time $t_5$, the Y address signal $Y_1$ is made low to turn OFF the transistor $Q_{Y1}$ and the Y address signal $Y_n$ is made high, to turn ON the transistor $Q_{Yn}$, so that the memory cell $M_{1n}$ is selected. As a result, the output signals ATD and $\overline{ATD}$ of the address transition detection circuit 5 are again charged to be low and high, respectively, and therefore, the equalizer ($Q_{E1}$, $Q_{E2}$) is turned ON. Thus, the sense voltage signal $V_s$ of the sense amplifier 2 and the reference voltage signal $V_{REF}$ of the reference circuit 3 are equalized, i.e., $V_s=V_{REF}$. At this time, since the bit line $BL_1$ is charged to increase the voltage $V_1(n)$ thereof, the voltage $V_2$ at the digit line $DL_1$ is decreased and the voltage $V_3$ at the node N1 is increased. As a result, the transistor 206 is turned ON, and therefore, the digit line $DL_1$ and the bit line $BL_1$ are charged by the transistors 205 and 207 of the sense amplifier 2 and the transistor 305 of the reference circuit 3 to increase the voltages $V_2$ and $V_1(n)$ thereof. Due to this charging operation, the sense voltage $V_s$ of the sense amplifier 2 and the reference voltage $V_{REF}$ of the reference circuit 3 are rapidly decreased.

When the charging operation of the digit line $DL_1$ and the bit line $BL_n$ proceeds, the voltage $V_3$ at the node N1 is decreased and the sense voltage $V_s$ ($=V_{REF}$) is increased. As a result, at time $t_6$, when the difference between the voltage $V_3$ and the voltage $V_2$ reaches the threshold voltage $V_{thn}$ of the transistor 206, the transistor 206 is turned OFF. After that, the charging operation for the node N2 ($V_s=V_{REF}$) is gradually carried out by only the transistor 205.

At time $t_7$, when the voltage $V_2$ at the digit line $DL_1$ enters an equilibrium state, the output signals ATD and $\overline{ATD}$ of the address transition detection circuit 5 are charged to be high and low, respectively, and the equalizer ($Q_{E1}$, $Q_{E2}$) is disabled, so that the sense amplifier 2 is electrically disconnected from the reference circuit 3. As a result, the sense voltage signal $V_s$ of the sense amplifier 2 is decreased to:

$$V_s(\text{off})=V_{cc}-V_{tho}-\beta \quad (2)$$

where $\beta$ is a definite value determined by a ratio of the current driving ability of the transistor 205 to the on-current of the memory cell such as $M_{1n}$. On the other hand, the reference voltage signal $V_{REF}$ remains at $$V_{REF}=V_{REFO}$$

Therefore, at time $t_8$, when $V_{REF}-V_s>\alpha$, the comparator 4 converts its output DO from high to low.

Thus, a data "0" sense speed is determined by a time period from time $t_5$ to time $t_8$.

Thus, in the prior art ROM device of FIG. 1, since the charging operation for the digit line $DL_1$ and the bit line such as $BL_1$ is carried out by the sense amplifier 2 and the reference circuit 3 combined by the equalizer ($Q_{E1}$, $Q_{E2}$), the power dissipation is large, although the sense operation speed is high.

On the other hand, page mode ROM's have been developed to increase the read operation speed. For example, in a usual read mode, if a byte (8 bits) data is read in 120 ns, eight bytes of data is read in 960 ns. Contrary to this, in a page mode, if a byte of data is also read in 120 ns, the first byte is read in 120 ns and the consecutive bytes of data are each read in 60 ns, so that eight bytes of data are read in 540 ns.

Figure 7:
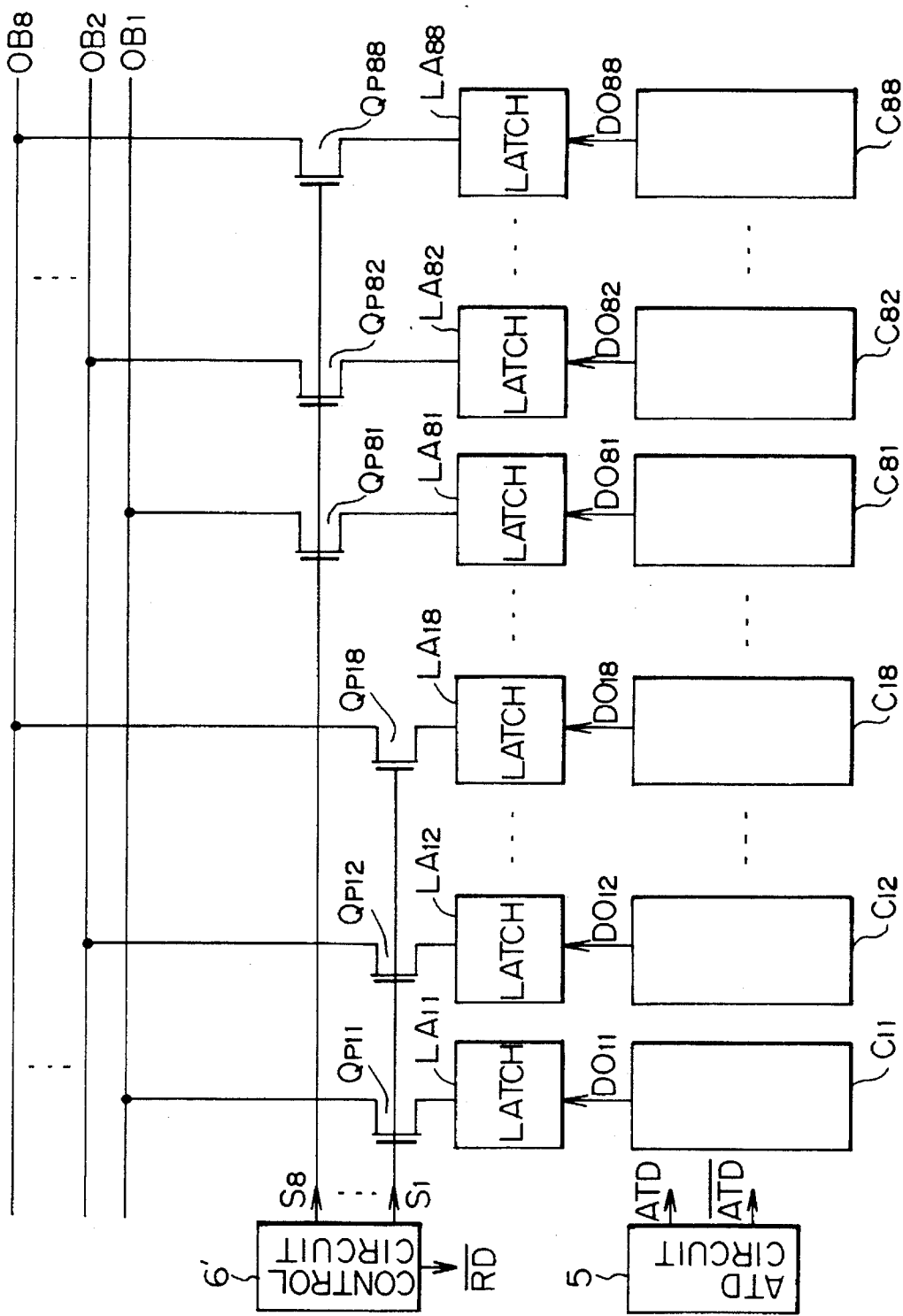
FIG. 7 is a circuit diagram illustrating a prior art page mode ROM device.
Figure 8:
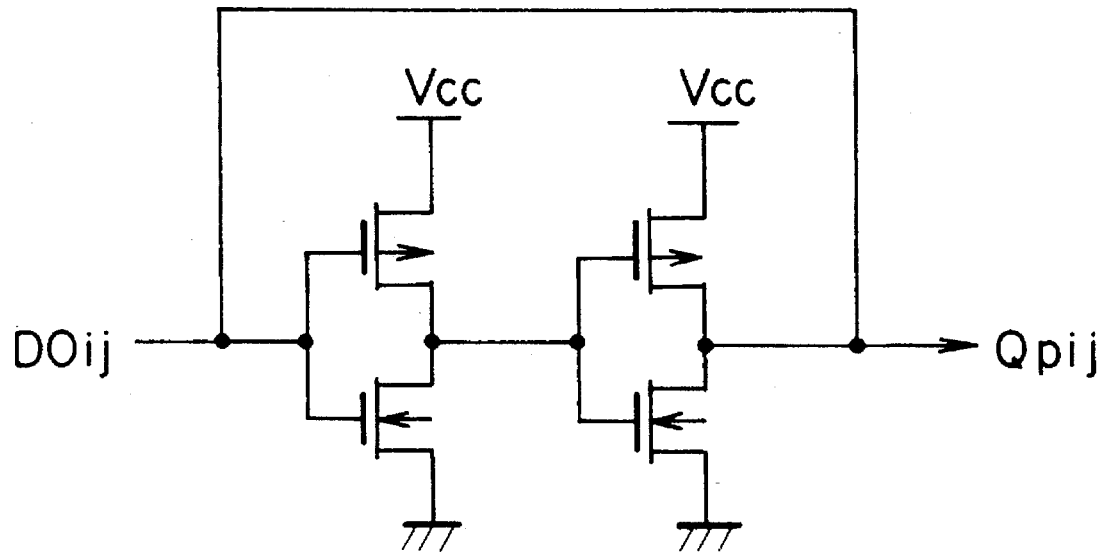
FIG. 8 is a circuit diagram of the latch circuit of FIG. 7.

In FIG. 7, which illustrates a prior art page mode ROM device for outputting 8 bytes (64 bits) in a page mode, sixty four circuits $C_{11}, C_{12}, \ldots, C_{18}, \ldots, C_{81}, \ldots, C_{82}, \ldots, C_{88}$ are provided. Each of the circuits $C_{11}, C_{12}, \ldots, C_{18}, \ldots, C_{81}, \ldots, C_{82}, \ldots, C_{88}$ includes the memory cell array 1, the sense amplifier 2, the reference circuit 3, the comparator 4, and the equalizer ($Q_{E1}$, $Q_{E2}$). Also, sixty four latch circuits $LA_{11}, LA_{12}, \ldots, LA_{18}, \ldots, LA_{81}, LA_{82}, \ldots, LA_{88}$ latch output signals $DO_{11}, DO_{12}, \ldots, DO_{18}, \ldots, DO_{81}, DO_{82}, DO_{88}$, respectively, of the circuits $C_{11}, C_{12}, \ldots, C_{18}, C_{81}, C_{82}, \ldots, C_{88}$. As illustrated in FIG. 8, each of the latch circuits is formed by two inverters connected in series. Provided between the latch circuits $LA_{11}, LA_{12}, \ldots, LA_{18}, \ldots, LA_{81}, LA_{82}, \ldots, LA_{88}$ and output buses $OB_1, OB_2, \ldots, OB_8$, are N-channel enhancement type transistors $Q_{p11}, Q_{p12}, \ldots, Q_{p18}, \ldots, Q_{p81}, Q_{p82}, \ldots, Q_{p88}$ which are controlled by page selection signals $S_1, \ldots, S_8$ generated from a control circuit 6'.

The page mode read operation of the ROM device of FIG. 7 will now be explained.

In a first read cycle, all of the circuits $C_{11}, C_{12}, \ldots, C_{18}, \ldots, C_{81}, \ldots, C_{82}, \ldots, C_{88}$ are enabled, so that the outputs $DO_{11}, DO_{12}, \ldots, DO_{18}, \ldots, DO_{81}, DO_{82}, DO_{88}$ thereof are simultaneously latched in the latch circuits $LA_{11}, LA_{12}, \ldots, LA_{18}, \ldots, LA_{81}, LA_{82}, \ldots, LA_{88}$, respectively. At this time, the page selection signal $S_1$ is made high to turn ON the transistors $Q_{p11}, Q_{p12}, \ldots, Q_{p18}$, so that data of page 1 is obtained at the output buses $OB_1, OB_2, \ldots, OB_8$.

In a second read cycle, the page selection single $S_2$ (not shown) is made high to turn ON the transistors $Q_{p21}, Q_{p22}, \ldots, Q_{p28}$ (not shown), so that data of page 2 is obtained at the output buses $OB_1, OB_2, \ldots, OB_8$.

Hereinafter, a similar page selection operation is performed upon data of page 3, page 4, ..., page 7.

Finally, in an eighth read cyle, the page selection single $S_8$ is made high to turn ON the transistors $Q_{p81}, Q_{p82}, \ldots, Q_{p88}$, so that data of page 8 is obtained at the output buses $OB_1, OB_2, \ldots, OB_8$.

Thus, in the page mode ROM device of FIG. 7, since the data of pages 2 to 8 is read from the latch circuits $LA_{21}, LA_{22}, \ldots, LA_{28}, \ldots, LA_{81}, LA_{82}, \ldots, LA_{88}$ which have already latched the data in the first read cycle, the read operation speed can be increased.

In the page mode ROM device of FIG. 7, however, since the number of reference circuits is large, the integration is deteriorated. For example, the entire area of the circuits $C_{11}, C_{12}, \ldots, C_{18}, \ldots, C_{81}, \ldots, C_{82}, \ldots, C_{88}$ except for the memory cell arrays is $$(10000\mu^2 + 10000\mu^2 + 4000\mu^2 + 1000\mu^2) \times 64 = 1.6 \text{ mm}^2 \quad (5)$$

In the formula (5), the area of each sense amplifier is $10000\mu^2$; the area of each reference circuit is $10000\mu^2$; the area of each comparator is $4000\mu^2$; and the area of each equalizer is $1000\mu^2$.

Also, in the page mode ROM device of FIG. 7, since all of the circuits $C_{11}, C_{12}, \ldots, C_{18}, \ldots, C_{81}, \ldots, C_{82}, \ldots, C_{88}$ including the reference circuits are enabled, the power dissipation thereof is large. For example, the entire power dissipated by the circuits $C_{11}, C_{12}, \ldots, C_{18}, \ldots, C_{81}, \ldots, C_{82}, \ldots, C_{88}$ except for the memory cell arrays is $$(1.5 \text{ mW} + 1.5 \text{ mW} + 2.5 \text{ mW}) \times 64 = 352 \text{ mW} \quad (6)$$

In the formula (6), the power dissipated by each sense amplifier is 1.5 mW, the power dissipated by each reference circuit is 1.5 mW, and the power dissipated by each comparator is 2.5 mW.

Figure 9:
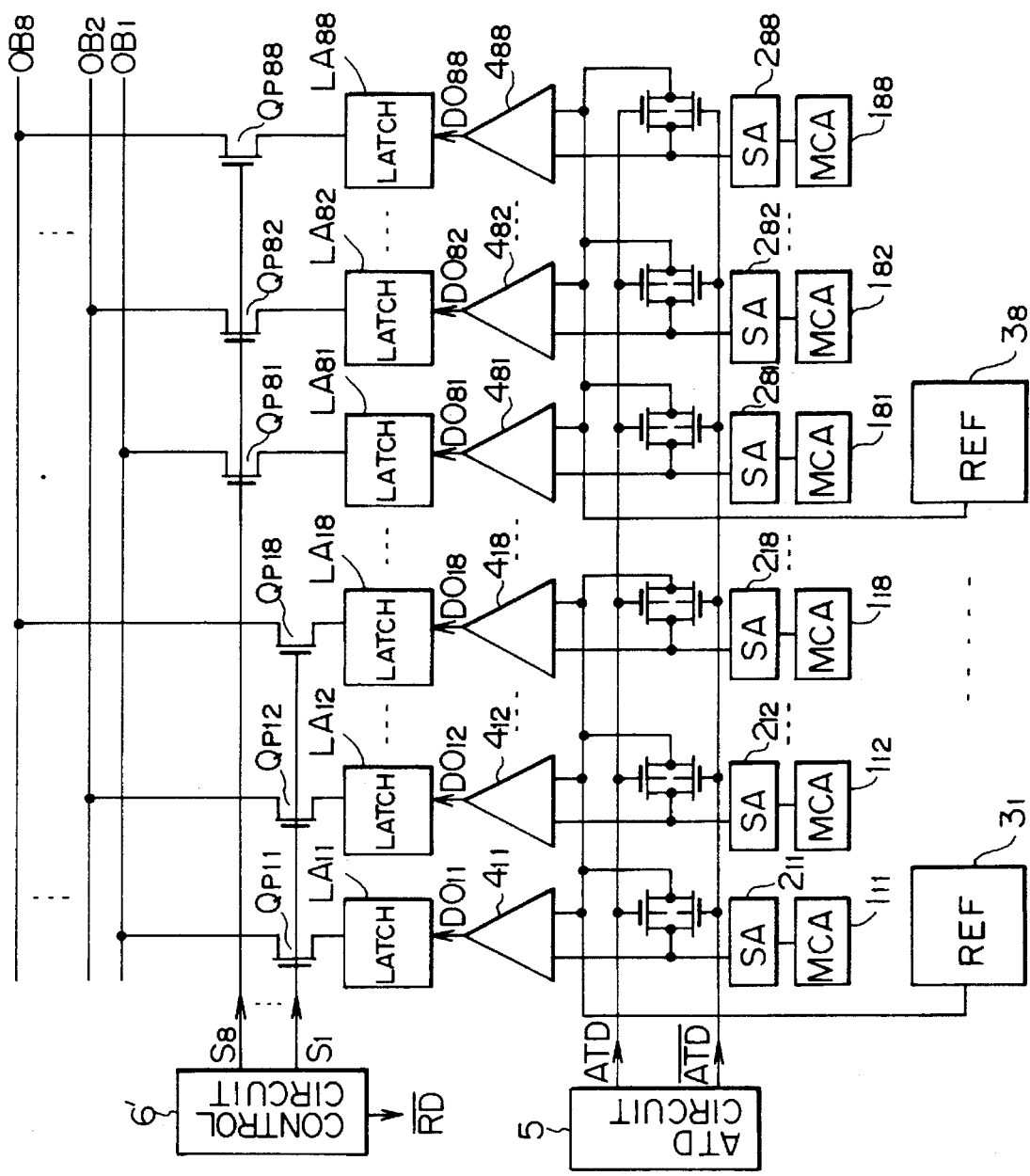
FIG. 9 is a circuit diagram illustrating another prior art page mode ROM device.

In FIG. 9, which illustrates another prior art page mode ROM device, one reference cirucit, such as $3_1$, is provided for eight sense amplifiers, such as $2_{11}, 2_{12}, \ldots, 2_{18}$. As a result, since the number of reference circuits is decreased, the integration and the power dissipation are improved as compared with the ROM devide of FIG. 7. For example, the area corresponding to the formula (5) is replaced by $$10000\mu^2 \times 64 + 10000\mu^2 \times 8 + 4000\mu^2 \times 64 + 1000\mu^2 \times 64 = 1.04 \text{ mm}^2 \quad (7)$$

Also, the power dissipation corresponding to the formula (6) is replaced by $$1.5 \text{ mW} \times 64 + 1.5 \text{ mW} \times 8 + 2.5 \text{ mW} \times 64 = 268 \text{ mW} \quad (8)$$

Figure 10:
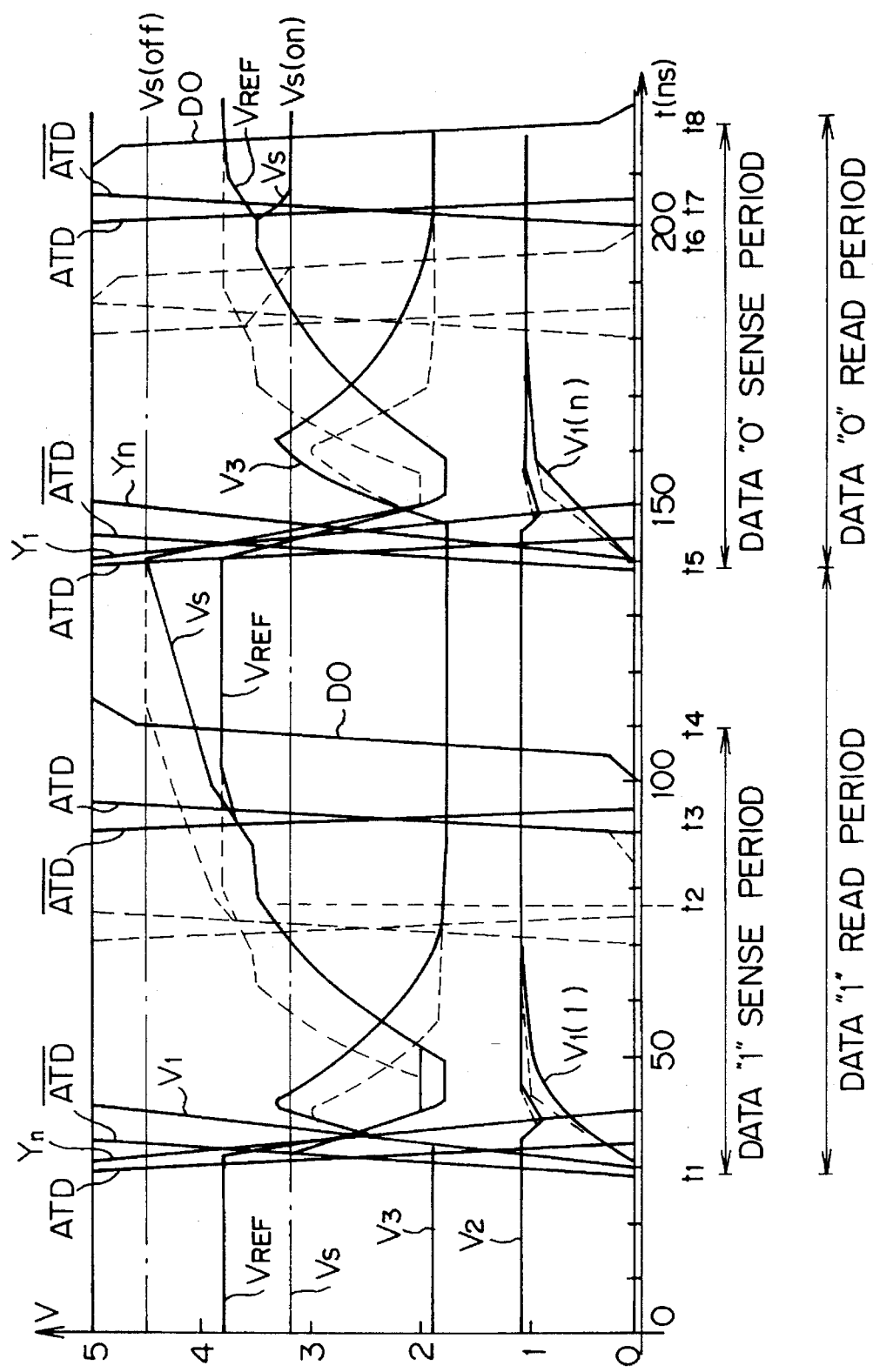
FIG. 10 is a timing diagram showing the operation of the ROM device of FIG. 9.

In the page mode of FIG. 9, however, the read operation speed is deteriorated as compared with the page mode ROM of FIG. 7. That is, during an equalizing period (ATD="0"), since only one reference circuit contributes to the charging operation for eight digit lines including eight bit lines, the time $t_2$ ($t_6$) for completing the charging operation is delayed as shown in FIG. 10, which shows the operation of the page mode ROM device of FIG. 9. As a result, a data "1" sense speed determined by a time period from time $t_1$ to time $t_4$ and a data "0" sense speed determined by a time period from time $t_5$ time $t_8$ are deteriorated.

Figure 11:
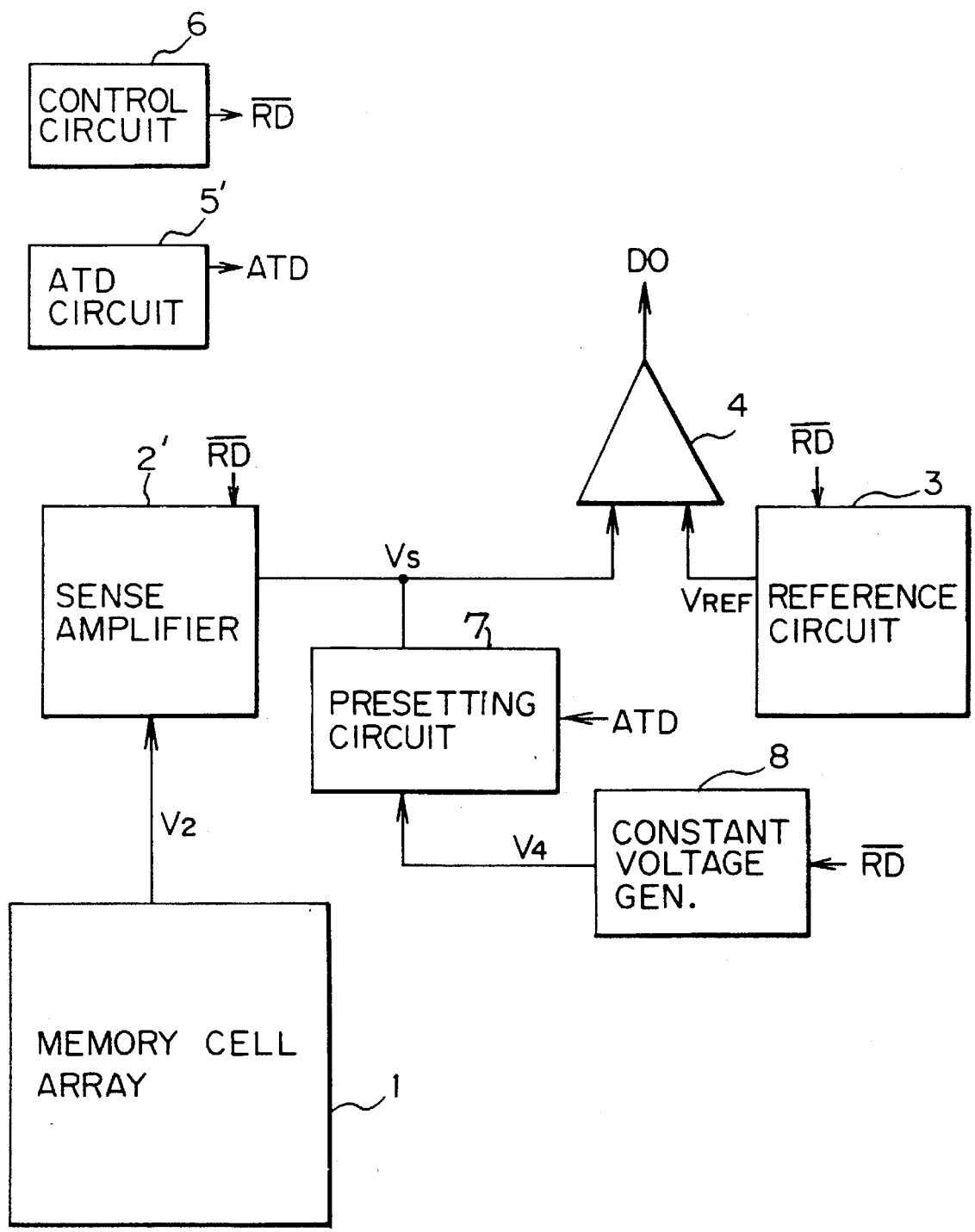
FIG. 11 is a circuit diagram illustrating a first embodiment of the ROM device according to the present invention.

In FIG. 11, which illustrates a first embodiment of the present invention, the equalizer ($Q_{E1}, Q_{E2}$) of FIG. 1 is not provided, and instead of this, a presetting circuit 7 and a constant voltage generating circuit 8 are added to the elements of FIG. 1. Also, the sense amplifier 2 of FIG. 1 is modified to a sense amplifier 2'. Further, since the signal ATD is required and the signal $\overline{ATD}$ is not required, an address transition detection circuit 5' generates only the signal ATD. The presetting circuit 7 presets the sense voltage signal $V_s$ at a definite voltage, and the constant voltage generating circuit 8 generates a constant voltage $V_4$ and transmits it to the presetting circuit 7.

The sense amplifier 2', the presetting circuit 7 and the constant voltage generating circuit 8 will be explained in detail with reference to FIG. 12.

The constant voltage generating circuit 8 includes two non-doped N-channel MOS transistors 801 and 802 serving as loads and a P-channel enhancement type MOS transistor 803 controlled by the read mode signal $\overline{RD}$. That is, when the read mode signal $\overline{RD}$ is low, the transistor 803 is turned ON, the constant voltage generating circuit 8 generates the constant voltage $V_4$ determined by a ratio of the current driving ability of the transistor 801 to that of the transistor 802.

The presetting circuit 7 includes a P-channel enhancement type MOS transistor 701 controlled by the signal ATD and a non-doped N-channel MOS transistor 702 controlled by the constant voltage $V_4$ of the constant voltage generating circuit 8. In this case, the current driving ability of the transistor 701 is sufficiently larger than that of the transistor 702, and also, the current driving ability of thea transistor 702 is sufficiently larger than that of the transistor 205 of the sense amplifier 2'. Further, the transistor 702 corresponds to the precharging transistor 207 of FIG. 2, and therefore, the transistor 207 of FIG. 2 is not included in the sense amplifier 2'.

Figure 12:
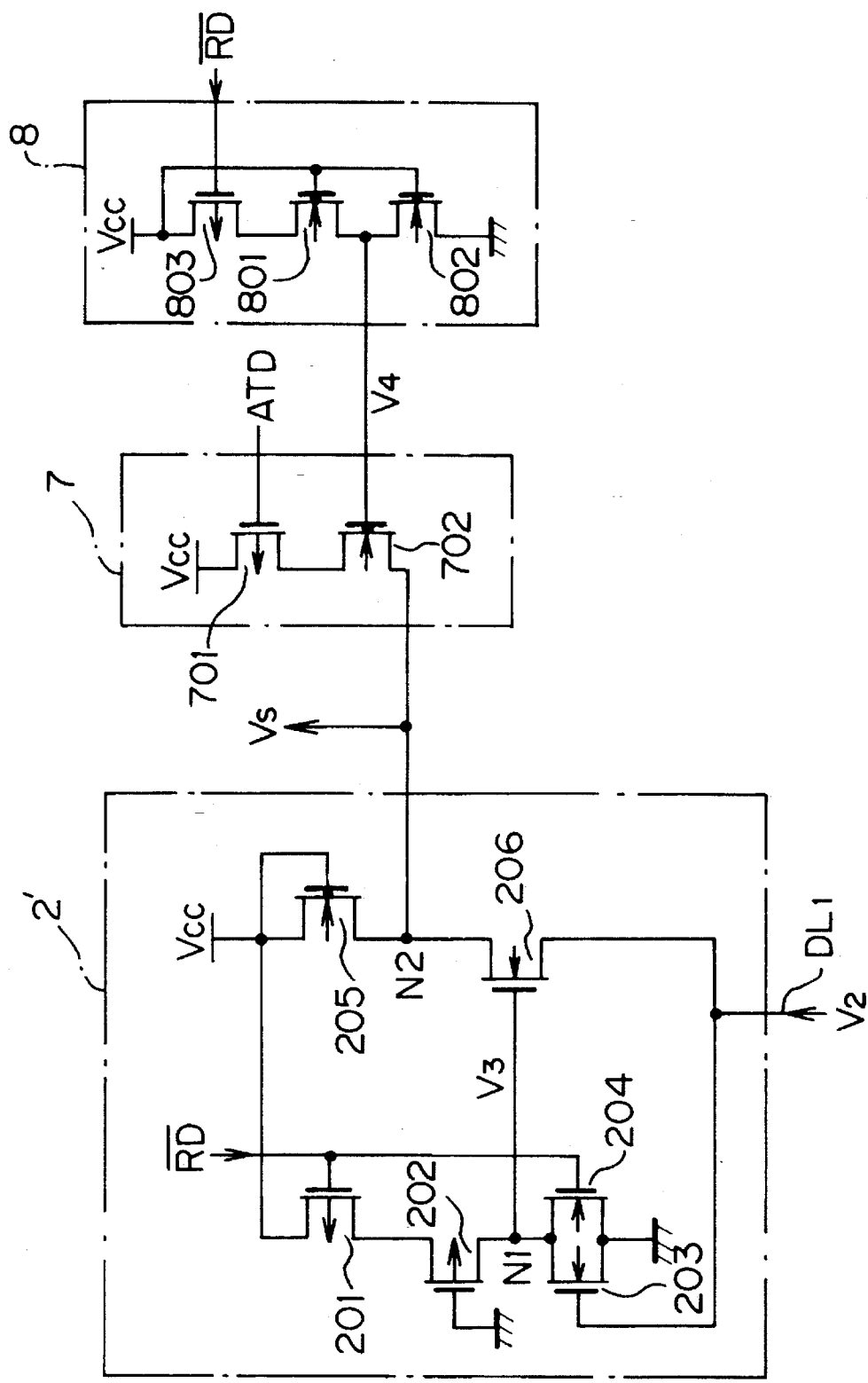
FIG. 12 is a circuit diagram of the sense amplifier, the presetting circuit and the constant voltage generating circuit of FIG. 11.

Thus, in FIG. 12, during a read mode ($\overline{RD}$="1"), the constant voltage $V_4$ is applied to the gate of the transistor 702, to thereby control the current driving ability thereof. In addition, during a precharging time period (ATD="0"), the digit line $DL_1$ including a selected bit line and the node N2 are charged by the transistors 701 and 702, to thereby preset the sense voltage $V_s$ at a definite value. After the precharging time period (ATD="1"), the transistor 701 is turned OFF, so that the digit line $DL_1$ and the node N2 are charged by only the transistor 205.

Note that the input/output characteristics as shown in FIG. 3 also apply to the transistor 206 of the sense amplifier 2'. Also, assume that the sense voltage $V_s$ is preset at a definite value $V_s(RS)$ by the presetting circuit 7 and the constant voltage generating circuit 8 after a precharging operation is completed. Further, the width and length of the transistor 702 and the pulse width of the signal ATD are determined so as to satisfy an equilibrium point P of FIG. 3.

The operation of the ROM device of FIG. 11 and 12 will be explained next with reference to FIG. 13. Also, in FIG. 13, assume that the read mode signal $\overline{RD}$ is low, and only the X address signal $X_1$ is made high and the other X address signals are low. Further, assume that the memory cell $M_{11}$ stores data "1" (off state) and the memory cell $M_{1n}$ stores data "0" (on state).

At time $t_1$, the Y address signal $Y_n$ is made low to turn OFF the transistor $Q_{Yn}$ and the Y address signal $Y_1$ is made high to turn ON the transistor $Q_{Y1}$, so that the memory cell $M_{11}$ is selected (see FIG. 1). As a result, the output signal ATD of the address transition detection circuit 5' is changed to be low, and therefore, the transistor 701 is turned ON. As a result, the digit line $DL_1$ and the node N2 of the sense amplifier 2' are charged. At this time, since the bit line $BL_1$ is charged to increase the voltage $V_1(1)$ thereof, the voltage $V_2$ at the digit line $DL_1$ is decreased and the voltage $V_3$ at the node N1 is increased. As a result, the transistor 206 is turned ON, and therefore, the digit line $DL_1$ and the bit line $BL_1$ are charged by the transistor 205 of the sense amplifier 2' and the transistors 701 and 702 of the reset circuit 7 to increase the voltages $V_2$ and $V_1(1)$ thereof. Due to this charging operation, the sense voltage $V_s$ of the sense amplifier 2' is rapidly decreased.

When the charging operation of the digit line $DL_1$ and the bit line $BL_1$ proceeds, the voltage $V_3$ at the node N1 is decreased and the sense voltage $V_s$ is increased. As a result, at time $t_2$, when the difference between the voltage $V_3$ and the voltage $V_2$ reaches the threshold voltage $V_{thn}$ of the transistor 206, the transistor 206 is turned OFF. At this time, the sense voltage $V_s$ reaches the preset value $V_s(PS)$.

At time $t_2$, the output signal ATD of the address transition circuit 5' is changed from low to high, and as a result, the transistor 701 is turned OFF. Therefore, after that, the charging operation for the node N2 is gradually carried out by only the transistor 205. As a result, the sense voltage $V_s$ of the sense amplifier 2 is increased at $V_s(\text{off})$ defined by the formula (2). On the other hand, the reference voltage signal $V_{REF}$ remains at $V_{REFO}$. Therefore, at time $t_3$, when $V_s - V_{REF} > \alpha$, the comparator 4 converts its output DO from low to high.

Thus, a data "1" sense speed is determined by a time period from time $t_1$ to time $t_3$.

Also, at time $t_4$, the Y address signal $Y_n$ is made low to turn OFF the transistor $Q_{Yn}$ and the Y address signal $Y_1$ is made high to turn ON the transistor $Q_{Y1}$, so that the memory cell $M_{1n}$ is selected (see FIG. 1). As a result, the output signal ATD of the address transition detection cirucit 5' is again changed to low, and therefore, the transistor 701 is turned ON. As a result, the digit line $DL_1$ and the node N2 of the sense amplifier 2' are charged. At this time, since the bit line $BL_n$ (see FIG. 1) is charged to increase the voltage $V_1(n)$ thereof, the voltage $V_2$ at the digit line $DL_1$ is decreased and the voltage $V_3$ at the node N1 is increased. As a result, the transistor 206 is turned ON, and therefore, the digit line $DL_1$ and the bit line $BL_n$ are charged by the transistor 205 of the sense amplifier 2' and the transistors 701 and 702 of the reset circuit 7 to increase the voltages $V_2$ and $V_1(n)$ thereof. Due to this charging operation, the sense voltage $V_s$ of the sense amplifier 2' is rapidly decreased.

When the charging operation of the digit line $DL_1$ and the bit line $BL_n$ is advanced, the voltage $V_3$ at the node N1 is decreased and the sense voltage $V_s$ is increased. As a result, at time $t_5$, when the difference between the voltage $V_3$ and the voltage $V_2$ reaches the threshold voltage $V_{thn}$ of the transistor 206, the transistor 206 is turned OFF. At this time, the sense voltage $V_s$ reaches a preset value $V_s(PS)$.

At time $t_5$, the output signal ATD of the address transition circuit 5' is changed from low to high, and as a result, the transistor 701 is turned OFF. Therefore, after that, the charging operation for the node N2 is gradually carried out by only the transistor 205. As a result, the sense voltage $V_s$ of the sense amplifier 2 is decreased to $V_s(\text{on})$ defined by the formula (4). On the other hand, the reference voltage signal $V_{REF}$ remains at $V_{REFO}$. Therefore, at time $t_6$, when $V_{REF} - V_s > \alpha$, the comparator 4 converts its output DO from high to low.

Thus, a data "0" sense speed is determined by a time period from time $t_4$ to time $t_6$.

Figure 13:
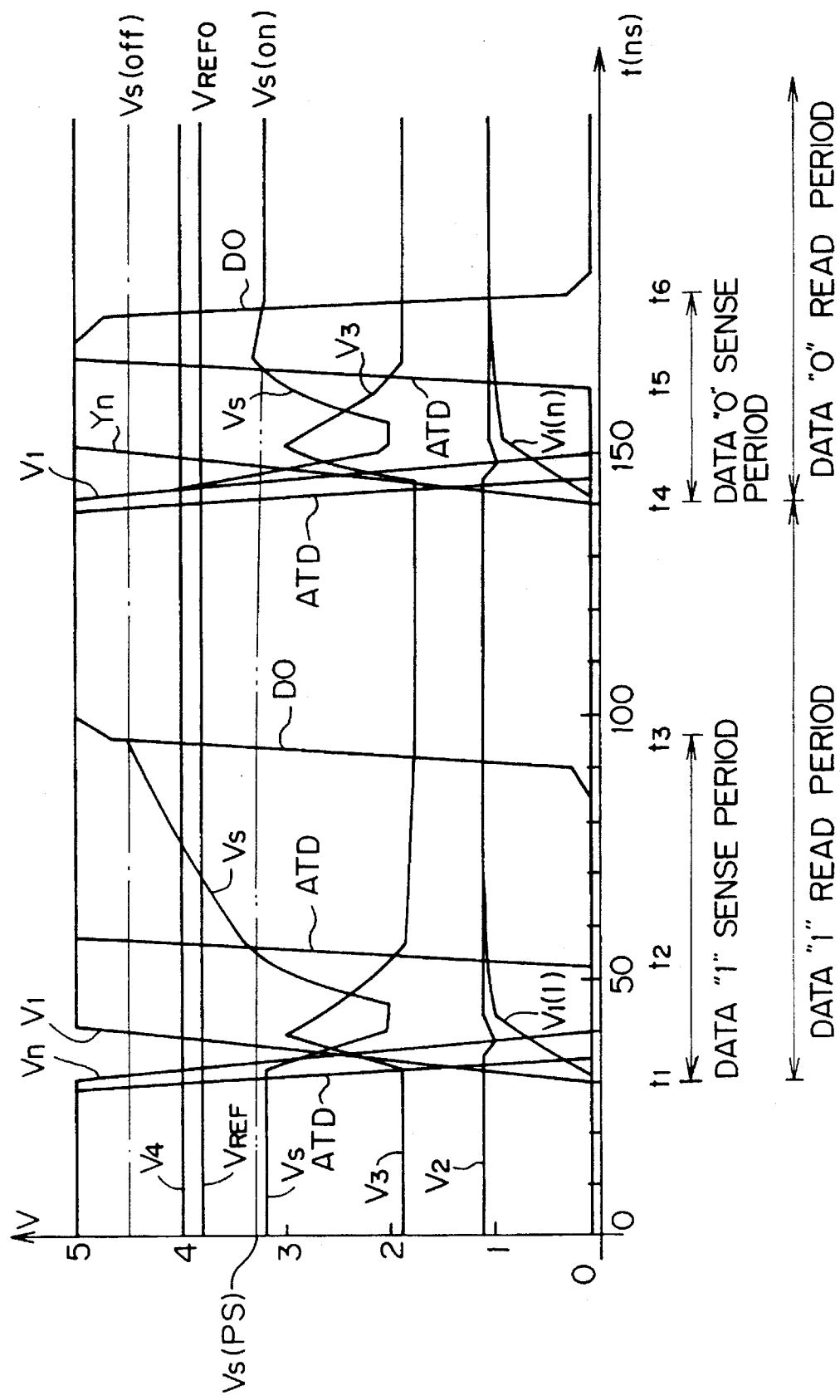
FIG. 13 is a timing diagram showing the operation of the ROM device of FIGS. 11 and 12.

As shown in FIG. 13, since the preset value $V_s(PS)$ of the sense voltage $V_s$ is set nearly at the level of the value $V_s(\text{on})$ defined by the formula (4), the data "0" sense speed is determined approximately by the pulse width of the signal ATD, and is not dependent upon a current flowing through the memory cell having data "0".

Figure 14:
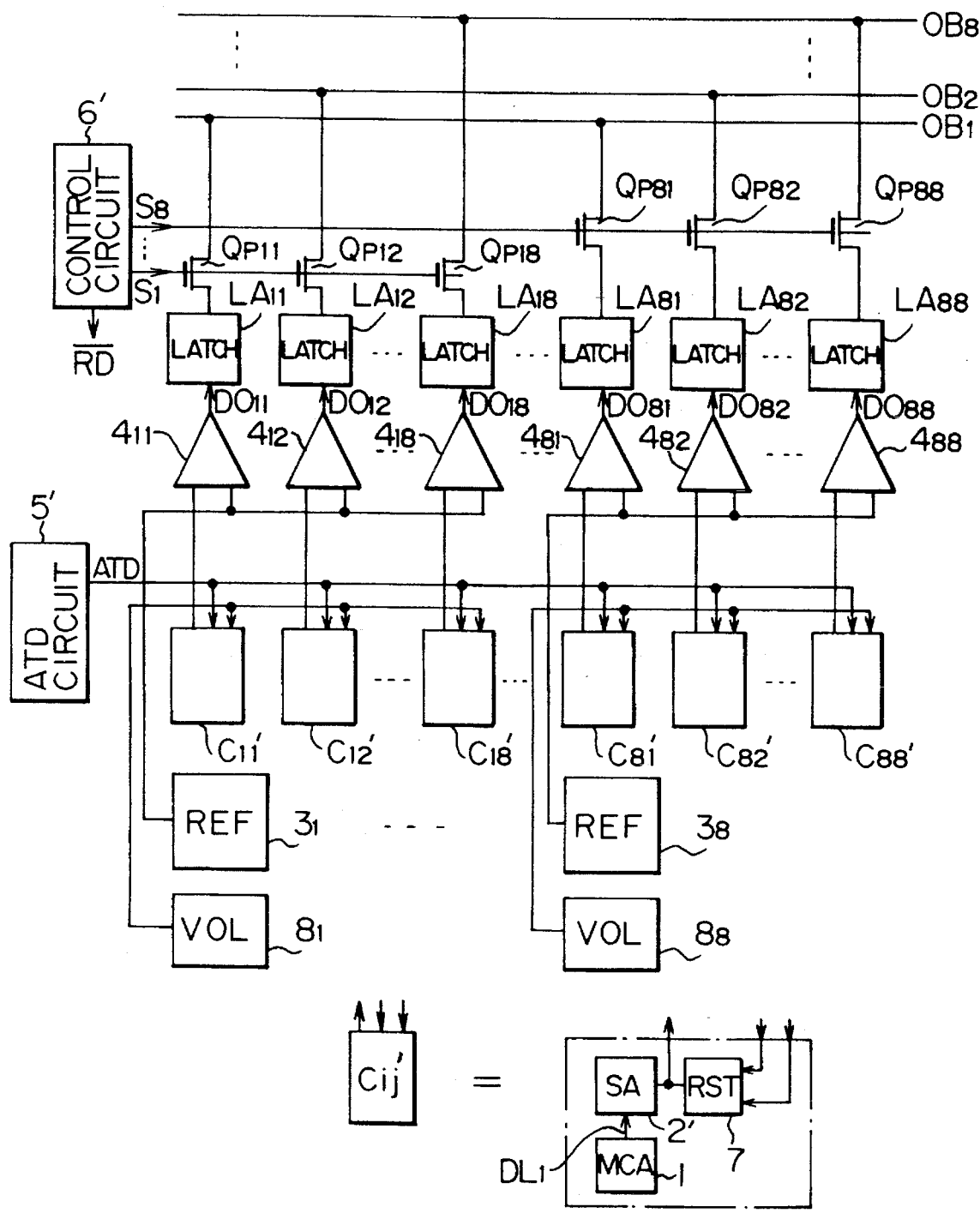
FIG. 14 is a circuit diagram illustrating a second embodiment of the ROM device according to the present invention.

In FIG. 14, which illustrates a second embodiment of the present invention, the ROM device of FIG. 11 is applied to a page mode ROM device for outputting 8 bytes (64 bits) in a page mode, and sixty four circuits $C_{11}', C_{12}', \ldots, C_{18}', \ldots, C_{81}', \ldots, C_{82}', \ldots, C_{88}'$ are provided Each of the circuits $C_{11}', C_{12}', \ldots, C_{18}', \ldots, C_{81}', C_{82}', \ldots, C_{88}'$ includes the memory cell array 1, the sense amplifier 2', and the presetting circuit 7. Also, one reference circuit, such as $3_1$, is provided for eight of the circuits such as $C_{11}', C_{12}', \ldots, C_{18}'$. Further, one constant voltage generating circuit, such as $8_1$ is provided for eight of the circuits, such as $C_{11}', C_{12}', \ldots, C_{18}'$. That is, since the reference circuits cannot perform a charging operation upon the digit lines and the like, the number of reference circuits can be reduced. Also, since the constant voltage generating circuits simply generate voltages, the number of constant voltage generating circuits can be reduced.

The operation of the page mode ROM device of FIG. 14 is similar to that of the page mode ROM device of FIG. 7 or 9, and therefore, the description thereof is omitted.

In the page mode ROM device of FIG. 14, since the number of reference circuits is reduced, the integration is improved. For example, the entire area of the circuits $C_{11}', C_{12}', \ldots, C_{18}', \ldots, C_{81}', \ldots, C_{82}', \ldots, C_{88}'$ (except for the memory cell arrays), the reference circuits $3_1, 3_2, \ldots, 3_8$, the constant voltage generating circuits $8_1, 8_2, \ldots, 8_8$, and the comparators $4_{11}, 4_{12}, \ldots, 4_{81}, 4_{82}, \ldots, 4_{88}$ is $$9000\mu^2 \times 64 + 10000\mu^2 \times 8 + 2000\mu^2 \times 64 + 3000\mu^2 \times 8 + 4000\mu^2 \times 64 = 1.06 \text{ mm}^2 \quad (9)$$

In the formula (9), the area of each sense amplifier is $9000\mu^2$; the area of each reference circuit is $10000\mu^2$; the area of each reset circuit is $2000\mu^2$; the area of each constant voltage generating circuit is $3000\mu^2$; and the area of each comparator is $4000\mu^2$. As compared with the formulae (5) and (7), it is clear that the integration is improved.

Also, in the page mode ROM device of FIG. 14, since the number of reference circuits is reduced, the power disspation is improved. For example, the entire power dissipated by the circuits $C_{11}', C_{12}', \ldots, C_{18}', \ldots, C_{81}', C_{82}', \ldots, C_{88}'$ (except for the memory cell arrays), the reference circuits $3_1, 3_2, \ldots, 3_8$, the constant voltage generating circuits $8_1, 8_2, \ldots, 8_8$, and the comparators $4_{11}, 4_{12}, \ldots, 4_{81}, 4_{82}, \ldots, 4_{88}$ is $$1.5 \text{ mW} \times 64 + 1.5 \text{ mW} \times 8 + 0.5 \text{ mW} \times 8 + 2.5 \text{ mW} \times 64 = 2.72 \text{ mW} \quad (10)$$

In the formula (10), the power dissipated by each sense amplifier including one reset circuit is 1.5 mW; the power dissipated by each reference circuit is 1.5 mW; the power dissipated by each constant voltage generating circuit is 0.5 mW; and the power dissipated by each comparator is 2.5 mW. As compared with the formulae (6) and (8), it is clear that the power dissipation is improved.

Figure 15:
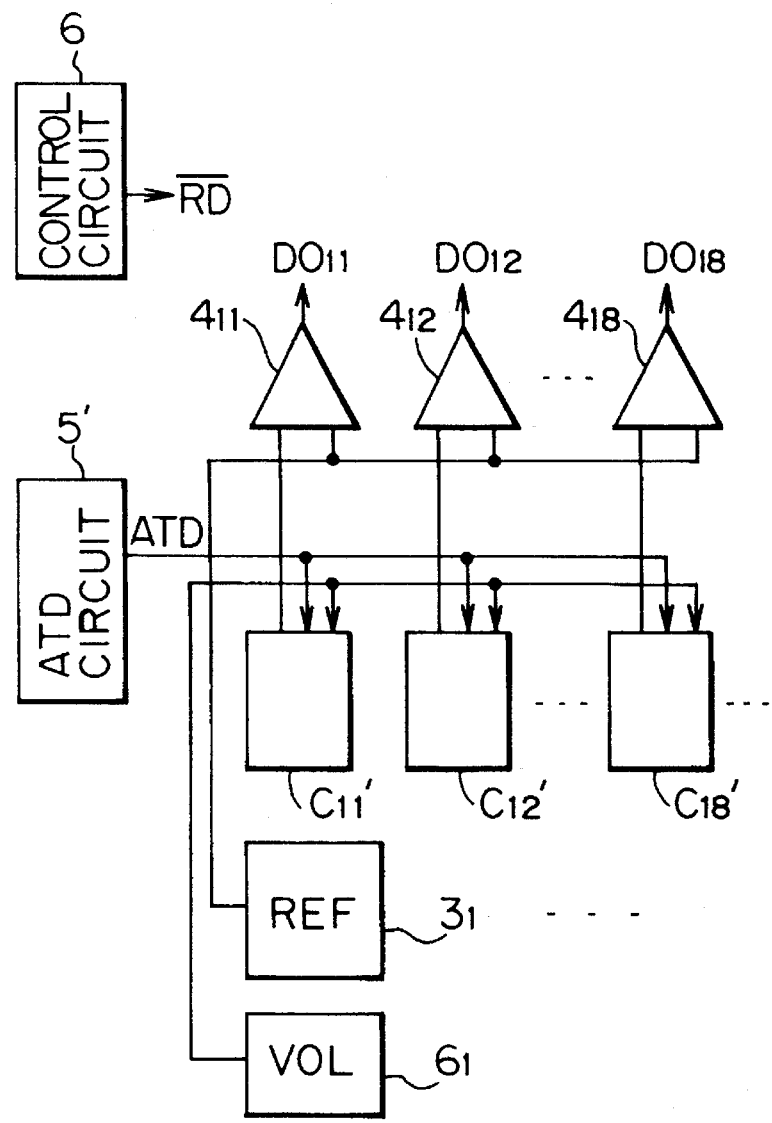
FIG. 15 is a circuit diagram illustrating a third embodiment of the ROM device according to the present invention.
Figure 15:
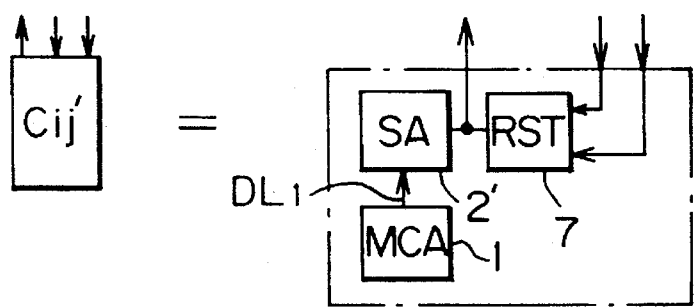

In FIG. 15, which illustrates a third embodiment of the present invention, the ROM device of FIG. 11 is applied to a ROM device for outputting 8 bit in a parallel output mode, and eight circuits $C_{11}'$, $C_{12}'$, ..., $C_{18}'$ are provided. Also, in this case, each of the circuits $C_{11}'$, $C_{12}'$, ..., $C_{18}'$, includes the memory cell array 1, the sense amplifier 2', and the reset circuit 7. Also, only one reference circuit $3_1$ is provided for the circuits, $C_{11}'$, $C_{12}'$, ..., $C_{18}'$. Futher only one constant voltage generating $8_1$ is provided for the circuits $C_{11}'$, $C_{12}'$, ..., $C_{18}'$.

Even in the ROM device of FIG. 15, the integration and the power dissipation can be improved as compared with a prior art 8-bit parallel output ROM device.

Figure 16B:
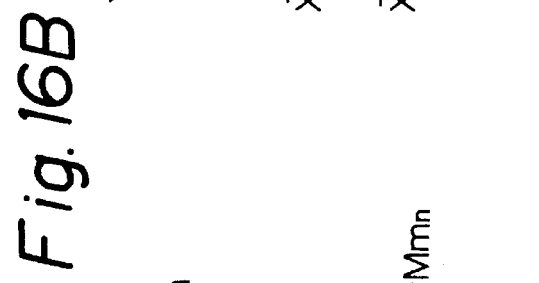
FIGS. 16A, 16B, 16C and 16D are circuit diagrams of modifications of the memory cell array of FIGS. 11, 14 and 15.
Figure 16D:
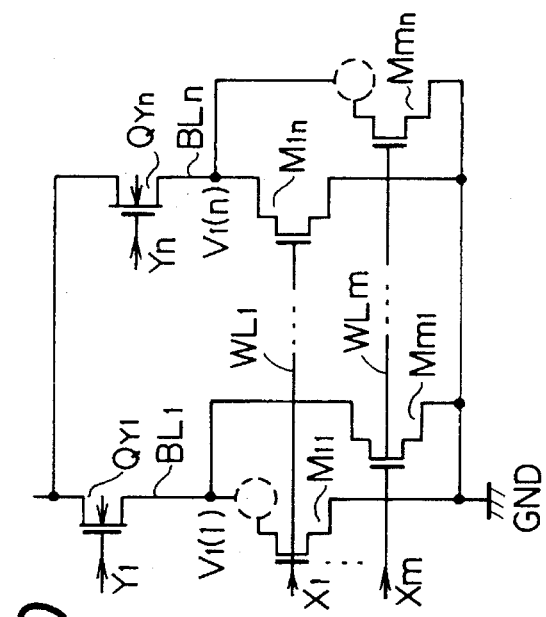
Figure 16A:
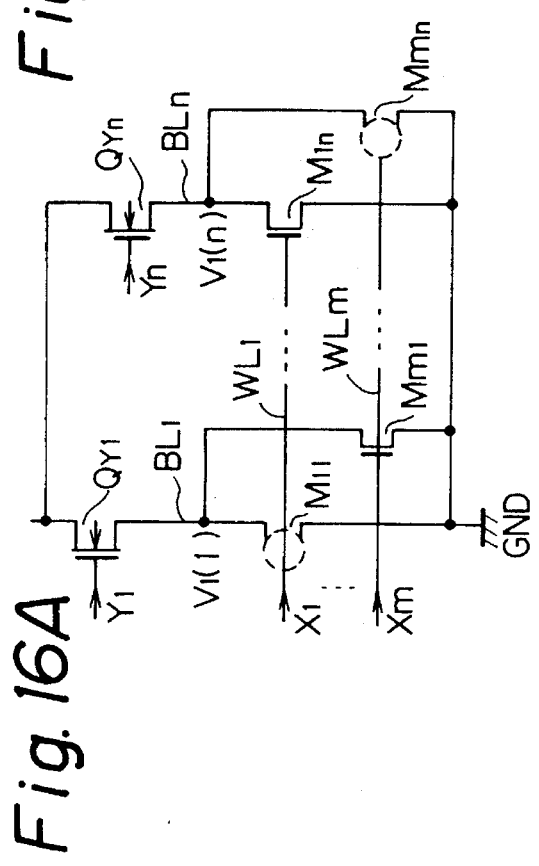
Figure 16C:
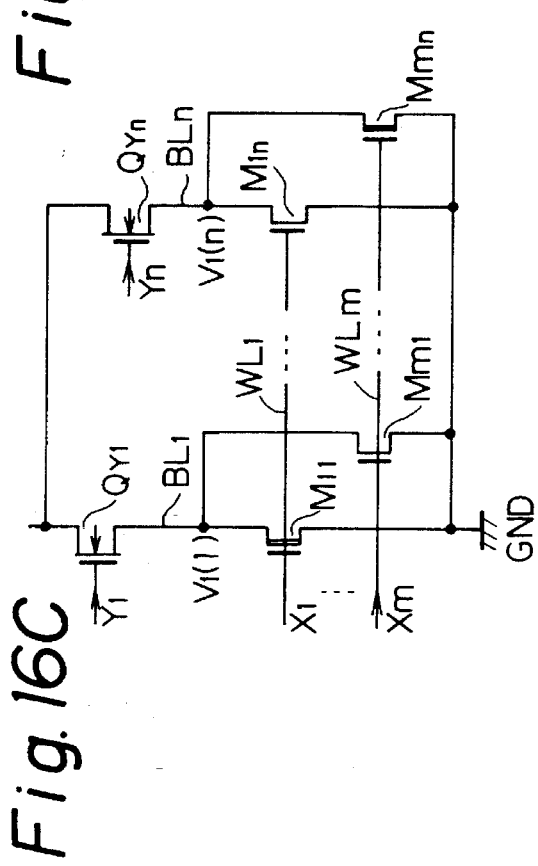

In FIGS. 11, 14 and 15, the memory cell array 1 can be constructed by mask ROM cells. For example, as illustrated in FIG. 16A, data "0" or "1" of a memory cell corresponds to the presence or absence of an enhancement type transistor. Also, as illustrated in FIG. 16B, data "0" or "1" corresponds to the low or high threshold voltage of a transistor. Further, as illustrated in FIG. 16C, data "0" or "1" corresponds to the depletion type or enhancement type of a transistor. Further, as illustrated in FIG. 16D, data "0" or "1" corresponds to the presence or absence of a contact window (throughhole) which connects a transistor to one bit line.

Figure 17:
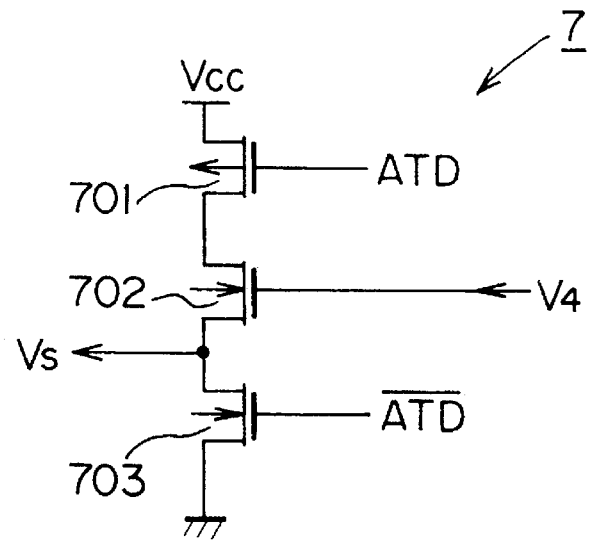
FIG. 17 is a circuit diagram of a modification of the presetting circuit of FIG. 12.

In FIG. 17, which is a modification of the presetting circuit 7 of FIG. 12, an N-channel enhancement type MOS transistor 703 controlled by an inverted signal of the signal ATD of the address transition detection circuit 5' is added. In this case, the preset value $V_s$ (PS) of the sense voltage $V_s$ is determined by a ratio of the current driving ability of the transistor 701 to that of the transistor 703 and the pulse width of the signal ATD.

Figure 18A:
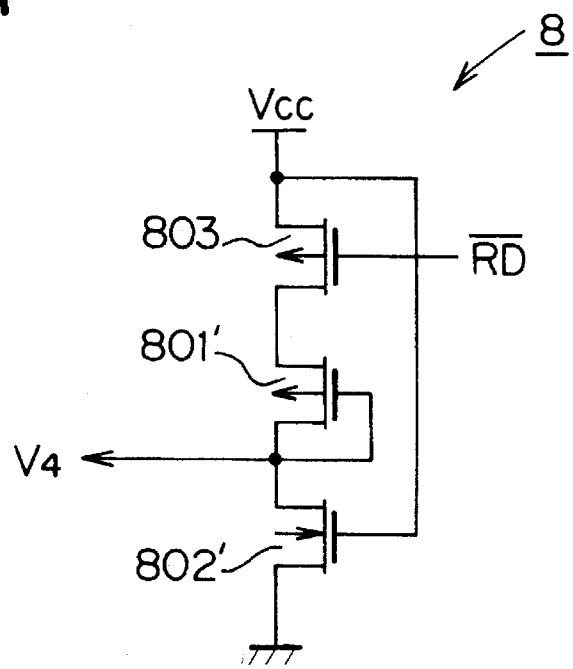
FIGS. 18A and 18B are diagrams of modifications of the constant voltage generating circuit of FIG. 12.

In FIG. 18A, which is a modification of the constant voltage generating circuit 8 of FIG. 12, a P-channel enhancement type MOS transistor 801' and an N-channel enhancement type MOS transistor 802' are provided instead of the transistors 801 and 802 of FIG. 12. Both of the transistors 801' and 802' serve as loads. Of course, other loads can be used as such.

Figure 18B:
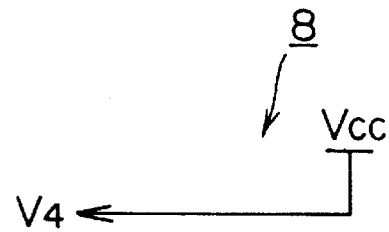

In FIG. 18B, which is also a modification of the constant voltage generating circuit 8 of FIG. 12, the constant voltage $V_4$ is derived directly from a power supply voltage terminal, such as the terminal depicted by $V_{cc}$. In this case, $V_4 = V_{cc}$, and therefore, the constant voltage $V_4$ is stable.

Also, it is possible to determine the preset voltage $V_s(PS)$ by the current driving ability of the transistor 702 and the threshold voltage $V_{tho}$ of the transistor 702, instead of the current driving ability of the transistor 702 and the pulse width of the signal ATD. In this case, the following condition needs to be satisfied:

$$V_{REF} - \alpha > V_4 - V_{tho} \tag{11}$$

As a result, the transistor 701 controlled by the signal ATD is unnecessary. That is, the transistor 702 serves a voltage limiter for the node N2.

As explained hereinbefore, according to the present invention, since a reference circuit does not contribute to a precharging operation or presetting operation of a sense amplifier, the power dissipation can be reduced. Also, in a page mode device and in a parallel bit output device, since the number of reference circuits can be reduced, the integration can be also improved simultaneously with the reduction of the power dissipation.

I claim:

1. A semiconductor memory device comprising:

a memory cell array including a plurality of read-only memory cells;

a digit line, connected to said memory cell array, said digit line receiving read data from a selected one of said read-only memory cells;

a sense amplifier, connected to said digit line, for sensing a voltage at said digit line to generate a sense voltage signal;

a presetting means, connected to said sense amplifier, for receiving an address transition detection signal to preset the sense voltage signal to a definite voltage;

a reference circuit for generating a reference voltage signal; and a comparator, connected to said sense amplifier and said reference circuit, for comparing the sense voltage signal with the reference voltage signal to generate an output signal with the voltage of the reference voltage signal connected to the comparator being constant regardless of a presetting operation of said presetting means.

2. A device as set forth in claim 1, wherein said read-only memory cells are of a nonvolatile type.

3. A device as set forth in claim 1, wherein said read-only memory cells are of a mask ROM cell type.

4. A device as set forth in claim 1, wherein said sense amplifier comprises:

a first switching element connected to a first power supply terminal and controlled by a read mode signal;

a first load element connected between said first switching element and a first node;

second and third switching elements connected in parallel between the first node and a second power supply terminal, said second switching element being controlled by the voltage at said digit line, said third switching element being controlled by the read mode signal;

a second load element connected between the first power supply terminal and a second node; and a fourth switching element connected between the second node and said digit line, said fourth switching element being controlled by a voltage at said first node, said second node generating the sense voltage signal.

5. A semiconductor memory device comprising:

a memory cell array including a plurality of read-only memory cells;

a digit line, connected to said memory cell array, said digit line receiving read data from a selected one of said read-only memory cells;

a sense amplifier, connected to said digit line, for sensing a voltage at said digit line to generate a sense voltage signal;

a presetting means, connected to said sense amplifier, for receiving an address transition detection signal to preset the sense voltage signal to a definite voltage;

a reference circuit for generating a reference voltage signal; and a comparator, connected to said sense amplifier and said reference circuit, for comparing the sense voltage signal with the reference voltage signal to generate an output signal, with the voltage of the reference voltage signal connected to the comparator being constant regardless of a presetting operation of said presetting means;

the presetting means includes:

(a) a constant voltage generating circuit for generating a constant voltage signal; and (b) a presetting circuit, connected to said constant voltage generating circuit, for presetting the sense voltage signal in accordance with the constant voltage signal, said presetting circuit being enabled by the address transition detection signal.

6. A device as set forth in claim 5, wherein said constant voltage generating circuit comprises at least two load elements connected in series between first and second power supply terminals.

7. A device as set forth in claim 6, wherein said constant voltage generating circuit further comprises a switching element connected in series to said at least two load elements and controlled by the read mode signal.

8. A device as set forth in claim 5, wherein said constant voltage generating circuit comprises a first power supply terminal.

9. A device as set forth in claim 5, wherein said presetting circuit comprises:

a fifth switching element connected to a first power supply terminal and being controlled by the address transition detection signal; and a load element connected between said fifth switching element and said sense amplifier, said load element being controlled by the constant voltage signal of said constant voltage generating circuit.

10. A device as set forth in claim 9, wherein said presetting circuit further comprises a sixth switching element connected between said load element and a second power supply terminal.

* * * * *